(12) United States Patent
Dove

(10) Patent No.: US 7,577,855 B2
(45) Date of Patent: Aug. 18, 2009

(54) SYSTEM FOR CONTROLLING CURRENT FLOW TO ELECTRONIC ATTACHMENT DEVICE

(75) Inventor: Daniel Joseph Dove, Colfax, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 684 days.

(21) Appl. No.: 10/850,167

(22) Filed: May 19, 2004

(65) Prior Publication Data

US 2005/0258895 A1 Nov. 24, 2005

(51) Int. Cl.
*G06F 1/00* (2006.01)
*H04B 10/00* (2006.01)

(52) U.S. Cl. .................. 713/300; 713/310; 398/115; 398/116; 398/117

(58) Field of Classification Search .............. 713/300, 713/310
See application file for complete search history.

(56) References Cited

U.S. PATENT DOCUMENTS

| | | | |
|---|---|---|---|
| 5,771,114 A * | 6/1998 | Andersson et al. ............ 398/38 |
| 6,496,103 B1 * | 12/2002 | Weiss et al. ................ 375/257 |
| 6,535,983 B1 * | 3/2003 | McCormack et al. ....... 713/310 |
| 6,571,181 B1 * | 5/2003 | Rakshani et al. ............. 702/60 |
| 6,651,177 B1 * | 11/2003 | Rantze et al. ............... 713/300 |
| 6,701,443 B1 * | 3/2004 | Bell ......................... 713/300 |
| 6,735,720 B1 * | 5/2004 | Dunn et al. .................. 714/43 |
| 7,058,825 B2 * | 6/2006 | Kobayashi ................. 713/300 |
| 7,162,650 B2 * | 1/2007 | Ke et al. .................... 713/300 |
| 7,203,851 B1 * | 4/2007 | Lo et al. .................... 713/310 |

* cited by examiner

*Primary Examiner*—Thomas Lee
*Assistant Examiner*—Ji H Bae

(57) ABSTRACT

A system for controlling power supplied by a power supply comprises an attachment device and a circuit coupled to the supply and operable to be coupled to the attachment device, the circuit operable to determine if the attachment device has an authorized source, the circuit further operable to disable power supplied to the attachment device if the attachment device does not have the authorized source.

12 Claims, 3 Drawing Sheets

SYSTEM FOR CONTROLLING CURRENT FLOW TO ELECTRONIC ATTACHMENT DEVICE

BACKGROUND

With the advent of the new 10GBASE-CX4 Ethernet media-type technology, methods of extending the range of 10-Gigabit networks beyond the 15-meter range accommodated by CX4 have been explored. One such method is to attach an optical-media converter (OMC) to a CX4 ports. OMCs allow 10-Gigabit interconnections of up to 300 meters over the copper-wire connectivity associated with CX4.

In order to power the OMC, a method of providing current through a network device interface (e.g., a network interface card) has been devised. This method employs shield connections through the interface as signal pins to convey low-frequency DC levels to power the OMC. Such signal pins may further be used for the exchange of regulating and other signals between the interface and the OMC.

FIG. 1 is an exemplary schematic illustration of such a method. A pair of dashed lines defines an interface 10 between circuitry residing on an OMC 20, and circuitry residing on a connector, such as a network interface card 30, residing in an electronic device, such as a computer system (not shown). The interface 10 comprises connection pins 40 that serve as connection points for the exchange of corresponding signals VCC_OUT, TYPE and ODIS (described in more detail below) between the OMC 20 and the interface card 30. The interface card 30 includes a hot-swap control circuit 50 and a laser-disable circuit 60. A current supply circuit 70 residing in the electronic device supplies current to the hot-swap control circuit 50 at connection pins VCC and V_FET_BIAS.

In operation, the hot-swap control 50 allows power to be supplied to a device via VCC_OUT only if the device qualifies itself according to parameters established by a window comparator 75 in combination with a pull-up resistor 76. The window comparator 75 enables the device to be powered via VCC_OUT upon mating with the interface card 30 only if the voltage of the TYPE signal associated with the device is within a validation range of voltages (e.g., between $\frac{1}{3}$ and $\frac{2}{3}$ of the supply voltage VCC). If, for example, a copper cable (i.e., a grounded attachment) was attached to the TYPE pin of the interface card 30, the voltage of the TYPE signal would be 0 and no power would be supplied via VCC_OUT. Similarly, if there is nothing attached to the TYPE pin of the interface card 30, the pull-up resistor 76 pulls the TYPE voltage up to VCC and no power would be supplied via VCC_OUT. In the example illustrated in FIG. 1, the TYPE signal associated with the OMC 20 is tied to ground by a resistor 77. If the resistor 77 and the resistor 76 associated with the hot-swap control 50 have an equal resistance value, a voltage divider is created at the TYPE signal. Consequently, the TYPE signal is approximately $\frac{1}{2}$ of the supply voltage VCC (i.e., within the validation range) and power would be supplied to the OMC via VCC_OUT.

The laser-disable circuit 60 allows the computer system to enable or disable, via the ODIS signal, a laser 80 associated with the OMC 20.

For purposes of compatibility and product support, computer system manufacturers may desire that their systems automatically discriminate certain OMCs from others (i.e., OMCs that are not produced by approved sources). Such discrimination may ideally be implemented by withholding VCC_OUT from OMCs that the manufacturer does not approve of.

SUMMARY

According to an embodiment of the present invention, a system for controlling power supplied by a power supply comprises an attachment device and a circuit coupled to the supply and operable to be coupled to the attachment device, the circuit operable to determine if the attachment device has an authorized source, the circuit further operable to disable power supplied to the attachment device if the attachment device does not have the authorized source.

DETAILED DESCRIPTION

Figure 1:
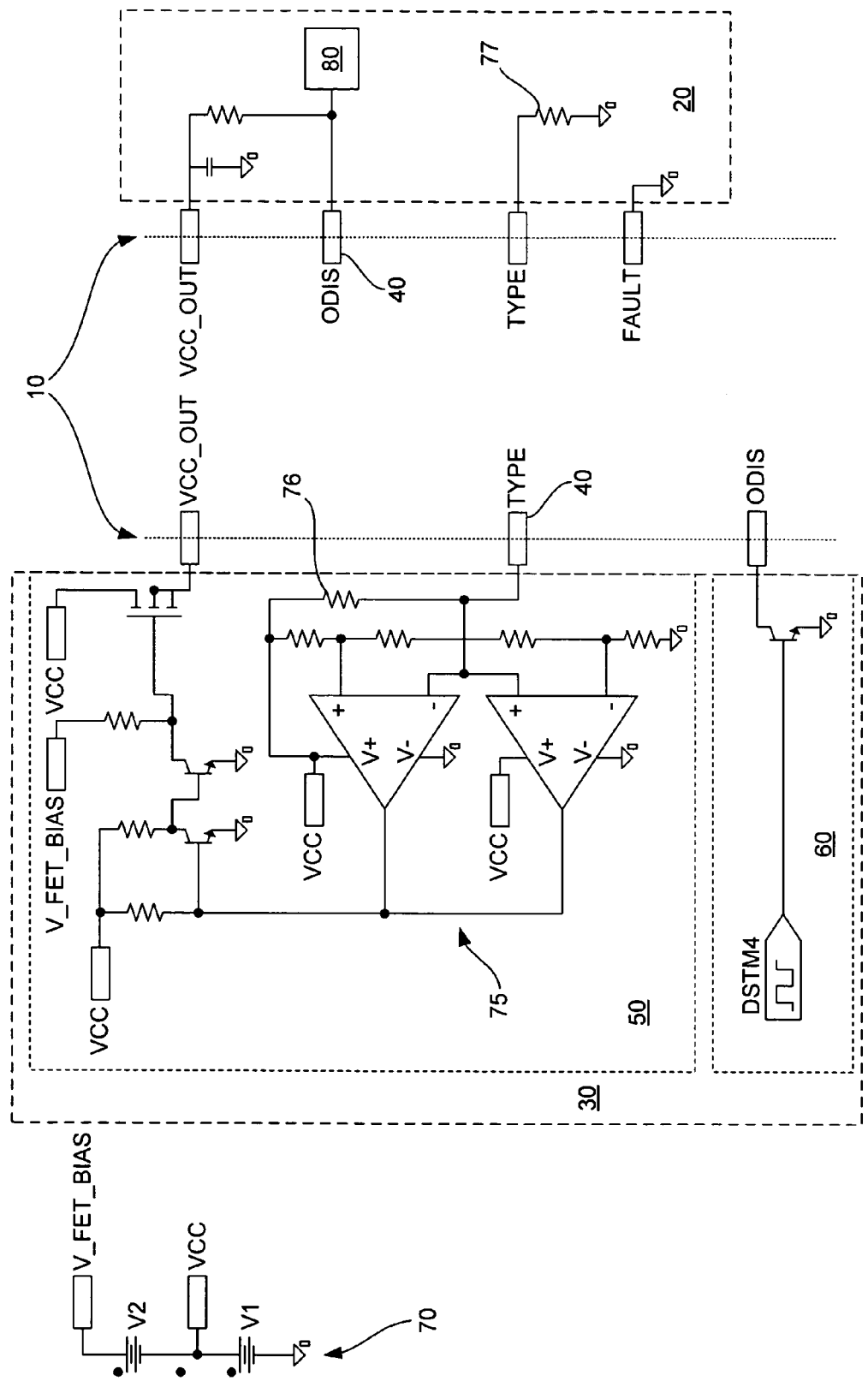
FIG. 1 is a schematic view of a network interface card and OMC according to the prior art.
Figure 2:
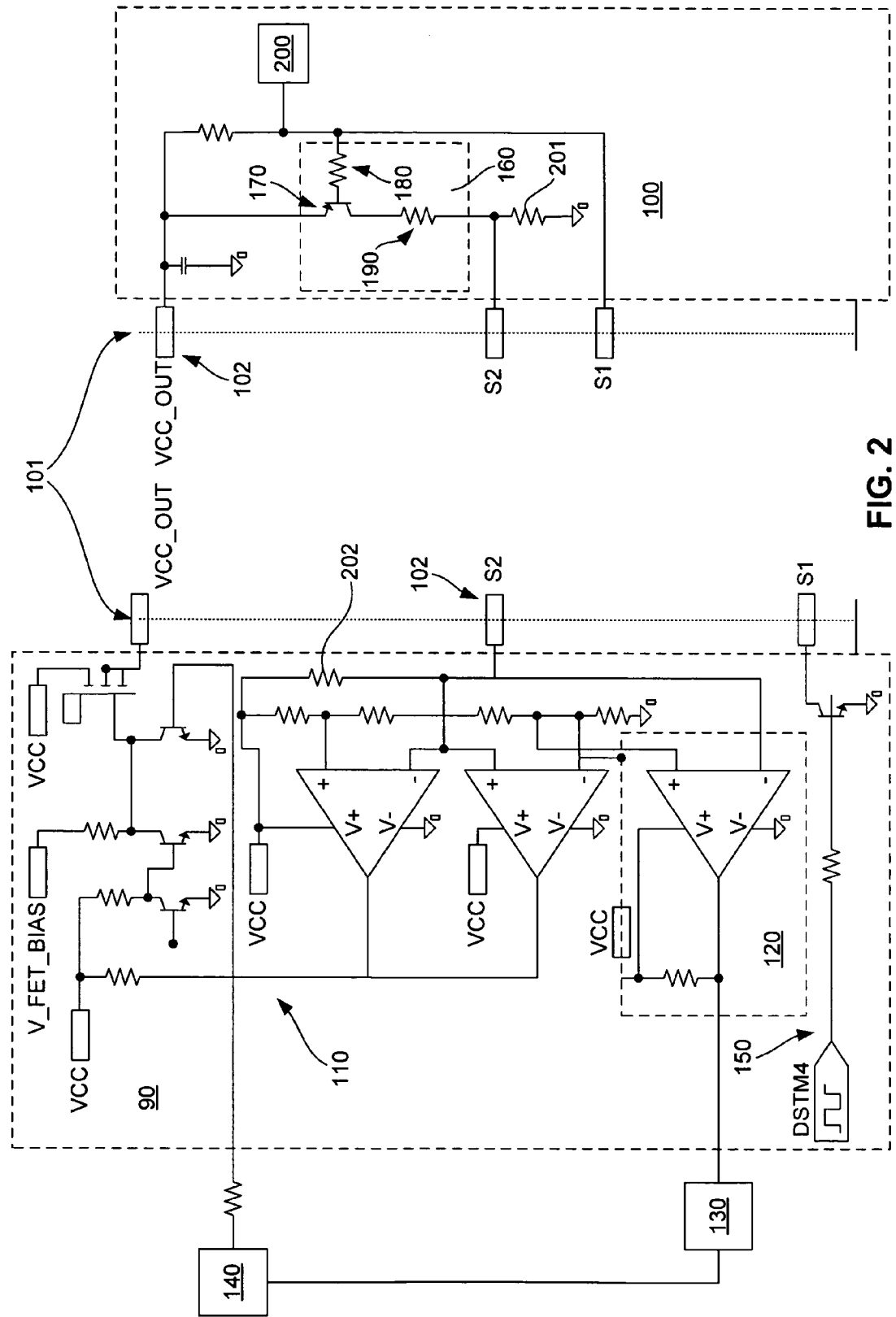
FIG. 2 is a schematic view of a network interface card and OMC according to an embodiment of the invention.

FIG. 2 is a schematic illustration of a connector, such as a network interface card 90, and an attachment device, such as an OMC 100, according to an embodiment of the present invention. Similar to the arrangement illustrated in FIG. 1, a pair of dashed lines defines an interface 101 between circuitry residing on the interface card 90 and the OMC 100. The interface 101 comprises connection pins 102 that serve as connection points for the exchange of corresponding signals VCC_OUT, S1 and S2 between the OMC 100 and the interface card 90. A current supply circuit (not shown), which may be similar to the supply circuit 70 illustrated in FIG. 1, generates VCC and V_FET_BIAS.

In the illustrated embodiment, the interface card 90 resides in an electronic system, such as a computer system (not shown), and comprises a hot-swap control circuit 110 similar in configuration and function to that of the hot-swap control 50 illustrated in FIG. 1. The interface card 90 further comprises a comparator circuit 120 (indicated by dashed lines) coupled to the hot-swap control 110. The hot-swap control 110 and the comparator circuit 120 are coupled to a qualifying control 130 and a VCC_OUT force-off control 140. The interface card 90 further comprises a toggle/disable circuit 150, the output of which is the signal S1.

The OMC 100 comprises a state-control circuit 160 (indicated by dashed lines). The circuit 160 comprises a PNP transistor 170, an impedance, such as a resistor 180, serially interposed between the signal S1 and the base of the transistor 170, and a second impedance, such as a resistor 190, serially interposed between the signal S2 and the collector of the transistor 170.

The toggle/disable circuit 150 is operable to toggle the signal S1 between a high-logic state (equal to VCC_OUT) and a low-logic state equal or nearly equal to 0 V. The toggled signal S1 may, in an embodiment, serve to switch a device, such as a laser 200 residing on the OMC 100, between an on state and an off state. Each state transition of the S1 signal causes the circuit 160 to produce a corresponding state transition of the signal S2 between high and low voltage values. The circuit 160 functions to ensure that the signal S2 has a high voltage value when the signal S1 is in a low-logic state and vice versa. Moreover, the resistance values of the resistors 201 and 202 are chosen such that the S2 signal, whether of a high or low voltage value, will remain within a validation range of voltages (e.g., between $\frac{1}{3}$ and $\frac{2}{3}$ of the supply voltage VCC) set by the hot-swap control 110. Accordingly, the OMC 100, upon mating with the interface card 90, is at all times identified to the hot-swap circuit 110 as eligible to receive current via VCC_OUT.

The comparator circuit 120 compares the state voltage of the signal S2 with a reference voltage that, because of the comparator circuit 120 and hot swap control 110 configurations, is approximately one-half of the supply voltage VCC. If the signal S2 has a high-voltage value, the comparator circuit 120 output voltage causes the qualifying control 130 to have a high-logic value. Conversely, if the signal S2 has a low-voltage value, the comparator circuit 120 output voltage causes the qualifying control 130 to have a low-logic value.

The current force-off control 140 provides a signal to the hot-swap control 110 that overrides the default functionality of the interface card 90 to apply power whenever S2 voltage is within the validation range. When the current force-off control 140 asserts a high-logic signal, current flow to the OMC 100 is disabled. When the current force-off control 140 asserts a low-logic signal, current is allowed to flow to the OMC 100. As discussed in detail below, the decision to assert a high-logic or a low-logic signal is based upon the combinatorial relationship of the signal S1 and the qualifying control 130.

Figure 3:
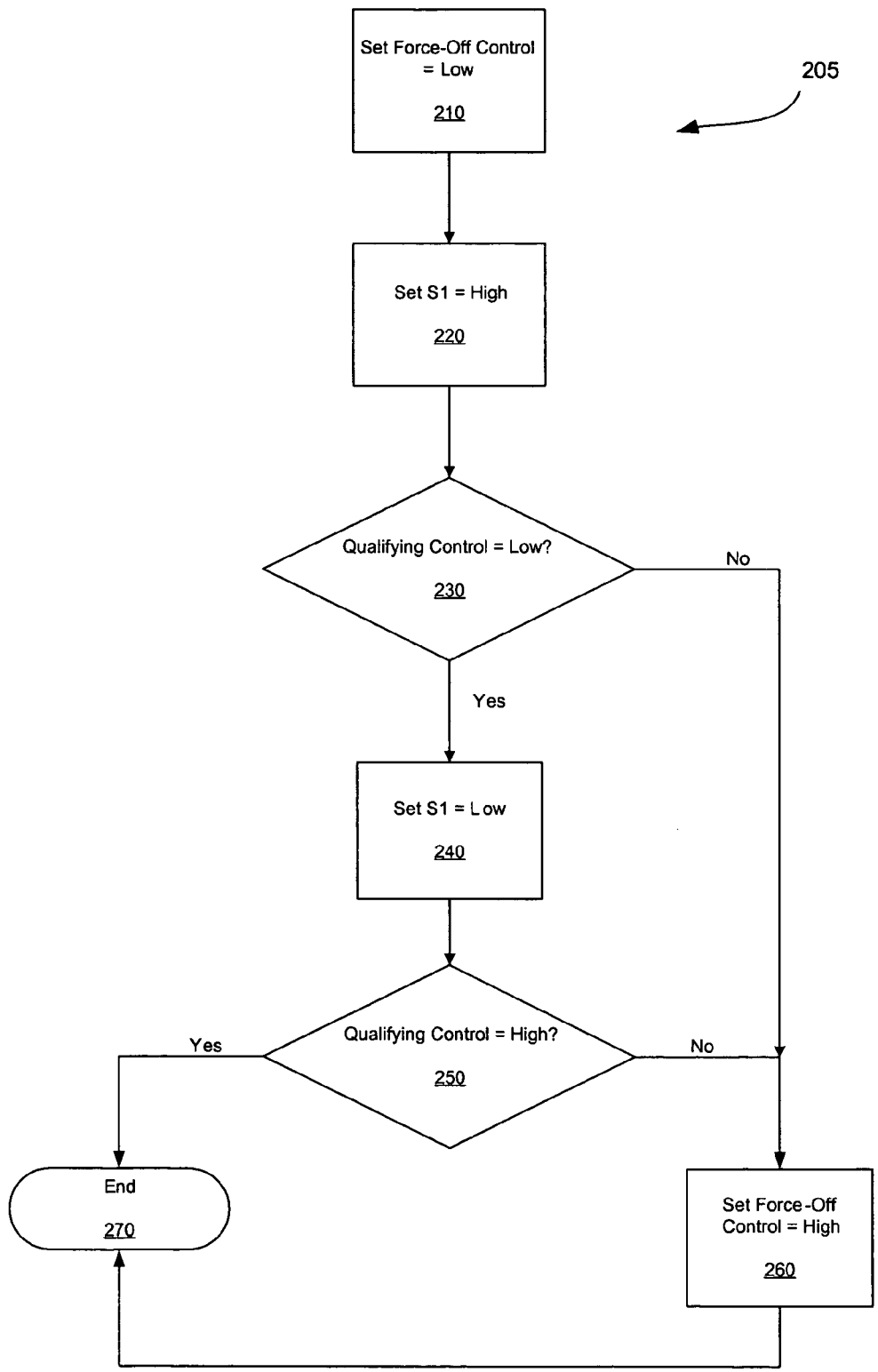
FIG. 3 is a flowchart illustrating a process, according to an embodiment of the invention, of controlling current flow to an OMC.

FIG. 3 illustrates a process 205, according to an embodiment of the invention, for controlling current flow to an attachment device and employing the elements illustrated in and described with reference to FIG. 2. In a first step 210, the force-off control 140 is set to a low-logic state, thereby enabling the interface card 90 to supply power to the OMC 100 via the VCC_OUT signal. In a step 220, the toggle circuit 150 sets the signal S1 to a high-logic state. In a step 230, the qualifying control 130 is evaluated. The qualifying control 130 either will remain in a high-logic state or will be set to a low-logic state depending on the state of the signal S2 as determined by the comparator circuit 120. If the qualifying control 130 is at a high-logic state the process continues to a step 260 at which time the force-off control 140 is set to a high-logic state, thereby disabling power to the OMC 100. The process 205 then ends at a step 270. If the qualifying control 130 is at a low-logic state the process continues to a step 240. In the step 240, the toggle circuit 150 sets the signal S1 to a low-logic state. At a step 250, the qualifying control 130 either will remain in a high-logic state or will be set to a low-logic state depending on the state of the signal S2 as determined by the comparator circuit 120. If the qualifying control 130 remains in a low-logic state (i.e., does not change state), then, at step 260, the force-off control 140 is set to a high-logic state, thereby disabling power to the OMC 100. The process 205 then ends at step 270. If the qualifying control 130 is set to a high-logic state (i.e., changes state), then the process 205 ends at the step 270 with the force-off control 140 remaining in a low-logic state and, consequently, power continuing to be supplied to the OMC 100.

The preceding discussion is presented to enable a person skilled in the art to make and use the invention. Various modifications to the disclosed embodiments will be readily apparent to those skilled in the art, and the generic principles herein may be applied to other embodiments and applications without departing from the spirit and scope of the present invention. For example, rather than employing the circuit 160, the OMC 100 could employ a register that stores a number that must match a number stored on the interface card 90 side in order for the OMC 100 to receive power. Thus, the present invention is not intended to be limited to the embodiments shown, but is to be accorded the widest scope consistent with the principles and features disclosed herein.

What is claimed is:

1. A system for controlling power supplied by a power supply, comprising:
   an attachment device; and
   a circuit coupled to the supply and operable to be coupled to the attachment device, the circuit including
   a connector initially conducting power at a first power level to the attachment device, and
   a control coupled to the connector, the connector operable to provide a first signal to and receive a second signal from the attachment device, the attachment device producing state transitions of the second signal responsive to state transitions of the first signal, the control using the state transitions of the first and second signals to determine if the attachment device is authorized to receive power, the connector continuing to conduct power at the first power level to the attachment device if the control determines the attachment device is authorized to receive power, wherein the second signal states each comprise a corresponding voltage level and the attachment device is operable to regulate each voltage level of the second signal states to be within a predetermined voltage-level range.

2. The system of claim 1, wherein the attachment device produces a high second signal logic in response to a low first signal logic.

3. The system of claim 1, wherein the first second-signal state is logic high.

4. The system of claim 1, wherein the connector comprises a comparator generating a third signal if the second signal voltage exceeds a predetermined reference voltage.

5. The system according to of claim 1, further comprising a hot-swap control receiving a fourth signal.

6. The system of claim 1, wherein the attachment device comprises:
   a transistor;
   a first signal input medium electrically coupled to the transistor;
   a second signal output medium electrically coupled to the transistor;
   a first impedance serially interposed between the first signal input medium and a transistor base; and
   a second impedance serially interposed between the second signal output medium and a transistor collector.

7. The system of claim 6, wherein the transistor comprises a PNP transistor.

8. The system according to claim 1, wherein the attachment device is a computing system and the first power level is sufficient to operate the computing system.

9. An attachment device operable to be coupled to and receive current supplied by an electronic system, comprising:
   at least one transmission medium operable to initially conduct current flow at a first current level from the electronic system to the attachment device, the at least one transmission medium further operable to receive a first signal from and provide a second signal to the electronic system; and
   a circuit coupled to the at least one transmission medium, the circuit operable to produce state transitions of the second signal in response to state transitions of the first signal, the electronic system, in response to a first state of the second signal, qualifying the attachment device to continue to receive current at the first current level from the electronic system, wherein the second signal states each comprise a corresponding voltage level and the attachment device is operable to regulate each voltage level of the second signal states to be within a predetermined voltage-level range.

10. A connector assembly for controlling current supplied by an electronic system to an attachment device, comprising:

at least one transmission medium operable to initially conduct current flow at a first current level to the attachment device, the at least one transmission medium further operable to provide a first signal to and receive a second signal from the attachment device; and a signal generator operable to generate to the electronic system a third signal corresponding to a first state of the second signal, the electronic system, in response to the third signal, qualifying the attachment device to continue to receive current at the first current level from the electronic system, wherein the signal generator is further operable to generate to the electronic system a fourth signal corresponding to a second state of the second signal, the electronic system, in response to the fourth signal, disqualifying the attachment device from receiving current at the first current level from the electronic system, and wherein the second signal states each comprise a corresponding voltage level and the attachment device is operable to regulate each voltage level of the second signal states to be within a predetermined voltage-level range.

11. A system, comprising:

an attachment device; and an electronic device operable to initially provide current having a first current level to the attachment device, the electronic device further operable to provide a first signal to and receive a second signal from the attachment device, the electronic device producing state transitions of the first signal, the attachment device producing state transitions of the second signal responsive to the first-signal state transitions, the electronic device, in response to a first state of the second signal, qualifying the attachment device to continue to receive current at the first current level from the electronic device, wherein the second signal states each comprise a corresponding voltage level and the attachment device is operable to regulate each voltage level of the second signal states to be within a predetermined voltage-level range.

12. A system for controlling the flow of current from a source, comprising:

means for initially conducting current to initially flow at a first current level to an attachment device;

means for providing a first signal and receiving a second signal;

means for producing state transitions of the second signal responsive to state transitions of the first signal; and means for continuing to conduct current to continue to flow at the first current level in response to qualifying the attachment device based on the state transitions of the first and second signals, wherein the second signal states each comprise a corresponding voltage level and the attachment device is operable to regulate each voltage level of the second signal states to be within a predetermined voltage-level range.

* * * * *

UNITED STATES PATENT AND TRADEMARK OFFICE
CERTIFICATE OF CORRECTION

| | | |
|---|---|---|
| PATENT NO. | : 7,577,855 B2 | Page 1 of 1 |
| APPLICATION NO. | : 10/850167 | |
| DATED | : August 18, 2009 | |
| INVENTOR(S) | : Dove | |

It is certified that error appears in the above-identified patent and that said Letters Patent is hereby corrected as shown below:

In column 4, line 6, in Claim 1, after "including" insert -- : --.

In column 4, line 33, in Claim 5, after "to" delete "of".

Signed and Sealed this
Twenty-eighth Day of December, 2010

David J. Kappos
*Director of the United States Patent and Trademark Office*